(12) United States Patent
Sun et al.

(10) Patent No.: US 6,893,882 B2
(45) Date of Patent: May 17, 2005

(54) MULTIVARIATE RBR TOOL AGING DETECTOR

(75) Inventors: Cheng-I Sun, Taipei (TW); Ben Fung, Hsin-Chu (TW); Yi-Chuan Lo, Hsin-Chu (TW); Wei-Hsuang Huang, Tao-Yuan (TW); Hsiang-Min Lin, Hsin-Chu (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 196 days.

(21) Appl. No.: 10/313,501

(22) Filed: Dec. 6, 2002

(65) Prior Publication Data

US 2004/0110310 A1 Jun. 10, 2004

(51) Int. Cl.[7] .............................................. H01L 21/66
(52) U.S. Cl. ....................................................... 438/14
(58) Field of Search .............................. 702/84; 438/52, 438/8, 14; 257/773

(56) References Cited

U.S. PATENT DOCUMENTS

| 5,943,550 | A | 8/1999 | Fulford, Jr. et al. | 438/14 |
| 6,148,239 | A | 11/2000 | Funk et al. | 700/1 |
| 6,245,581 | B1 | 6/2001 | Bonser et al. | 438/8 |
| 6,248,602 | B1 | 6/2001 | Bode et al. | 438/14 |
| 6,303,395 | B1 * | 10/2001 | Nulman | 438/14 |
| 6,405,144 | B1 * | 6/2002 | Toprac et al. | 702/84 |

* cited by examiner

Primary Examiner—John F. Niebling
Assistant Examiner—Andre' Stevenson

(57) ABSTRACT

A multiple run by run process is described. A plurality of tools and a plurality of products to be run on the tools are provided. Tool effects and product effects on a parameter are identified for each tool and each product. A desired recipe is calculated for each product on each tool based on the tool effects and product effects identified. Thereafter, the plurality of products is run on the plurality of tools. The desired recipe is updated after each run of each tool. Tool aging is calculated after each run of each tool based on the desired recipe used.

20 Claims, 4 Drawing Sheets

MULTIVARIATE RBR TOOL AGING DETECTOR

RELATED PATENT APPLICATION

U.S. patent application Ser. No. 10/749,698, to the same inventors, filed on Dec. 31, 2003.

BACKGROUND OF THE INVENTION (1) Field of the Invention

The present invention relates to the fabrication of integrated circuit devices, and more particularly, to a method of monitoring tool performance using a multivariate advanced process control system in the fabrication of integrated circuit devices.

(2) Description of the Prior Art

Run by Run (RBR) feedback control schemes have been used widely to control and monitor the semiconductor manufacturing processes. Statistical process control is combined with feedback control and uses data from past runs to adjust the recipe for the next run. This method offers the potential for reducing process variability caused by equipment aging, chemical depletion, or fluctuation in ambient conditions with a minimal cost. Most literature in the RBR control, however, is only applicable to the manufacturing process with a single product by a single tool. For a foundry industry, due to different customer requirements, one of the most popular production styles is multiple products by multiple tools. For example, if a process runs eight products by five tools, then there are forty combinations which will lead to a very complex situation using conventional RBR control schemes. If separate feedback schemes are set up for each combination, besides affecting the efficiency of the RBR control schemes, this method also ignores the useful information between the tools and products. For example, under a specific tool, an individual control scheme does feedback only on a specific product and it loses the opportunity to adjust for other products produced by the same tool. In addition, since customer orders may not be continuous and scheduled tool set-up may change from time to time, the feedback scheme for any production lot cannot be successfully applied to the next production lot. Therefore, it is desired to provide a multiple run by run control process.

A number of patents address process control issues. For example, U.S. Pat. No. 5,943,550 to Fulford, Jr. et al teaches a method of controlling transistor drive current across a wafer by varying light exposure based on parameters such as gate oxide thickness, RTA temperature, polyetch bias, etc. U.S. Pat. No. 6,148,239 to Funk et al shows a process control system using feed forward control to label materials in groups having common properties based on process variables, tool variables, and material variables. U.S. Pat. No. 6,248,602 to Bode et al discloses a method to store control input parameters such as for overlay control in a photolithography process, process a lot of devices, collect and analyze data for the lot, and perform automated rework based on the data analysis. U.S. Pat. No. 6,245,581 to Bonser et al teaches a method of measuring critical dimension, analyzing the measurement, and performing a secondary etch process based on the analysis.

SUMMARY OF THE INVENTION

Accordingly, it is a primary object of the invention to provide a multiple run by run process control method.

Another object of the invention is to provide a multiple run by run process control method that works across tools and products.

Yet another object is to provide a multiple run by run process to detect tool aging.

Yet another object is to provide a multiple run by run process to detect photolithography tool aging.

A further object is to provide a multiple run by run process to detect photolithography tool aging based on exposure dose.

A still further object is to provide a multiple run by run process to update a recipe based on past data.

Another object of the invention is to provide a multiple run by run process to update a recipe for a particular tool and product based on tool decay and variation shift of product.

In accordance with the objects of the invention, a multiple run by run process is achieved. A plurality of tools and a plurality of products to be run on the tools are provided. Tool effects and product effects on a parameter are identified for each tool and each product. A desired recipe is calculated for each product on each tool based on the tool effects and product effects identified. Thereafter, the plurality of products is run on the plurality of tools. The desired recipe is updated after each run of each tool. Tool aging is calculated after each run of each tool based on the desired recipe used.

BRIEF DESCRIPTION OF THE DRAWINGS

In the accompanying drawings forming a material part of this description, there is shown.

DESCRIPTION OF THE PREFERRED EMBODIMENTS

Figure 1:
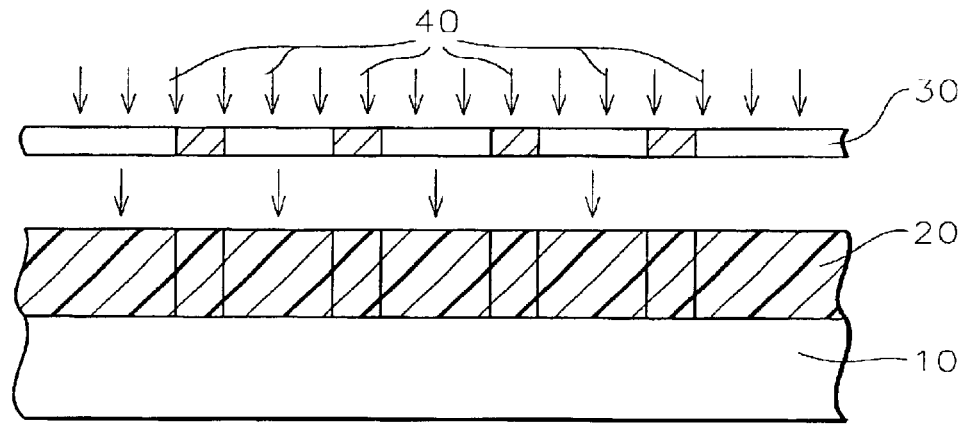
FIGS. 1 and 2 are cross-sectional representations of a photolithographic process.
Figure 2:
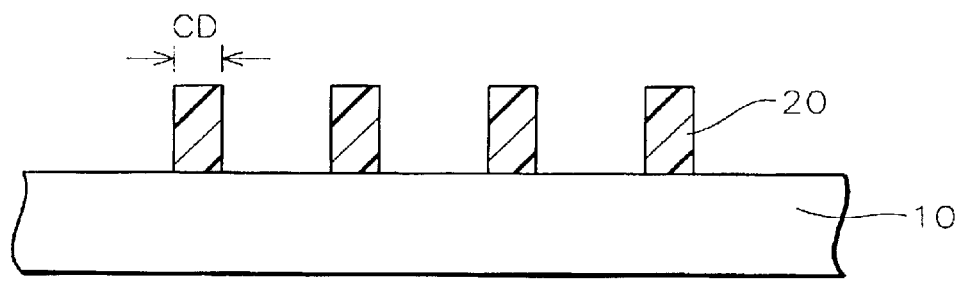

The process of the present invention provides a multiple run by run process control method. The multiple run by run (MRBR) process control method of the present invention can be used for any process in semiconductor manufacturing. The photolithography process will be used to demonstrate the MRBR scheme of the present invention. FIGS. 1 and 2 illustrate the photolithography process flow. FIG. 1 shows a wafer 10 covered by a photoresist layer 20. A mask 30 is placed over the wafer. The photoresist is exposed to light 40 through the mask. The photoresist is developed to leave the patterned photoresist layer shown in FIG. 2.

The quality characteristic of the photolithography process is critical dimension (CD), shown in FIG. 2. According to physical knowledge, CD is a function of the input recipe and the exposure dose (E). The increment or decrement of the exposure dose will lead to a proportional change in CD. That is, $$\text{delta } CD = \beta \times \text{delta } E \qquad (1)$$

where β is the slope. Based on this relationship, the MRBR controller is to adjust the exposure dose setting such that CD will meet a specific target.

The exposure dose depends strongly on the combination of products and tools. Thus, we try to express each exposure dose by the product effect and the tool effect. Let E(i,j) denote the exposure does for the i-th product by the j-th tool. Then, $$E(i,j)=P(i)\times T(j)+C(i,j) \qquad (2)$$

where P(i) denotes the effect of the i-th product, T(j) denotes the effect of the j-th tool and C(i,j) denotes the correction for the exposure dose which can be regarded as the error term of equation (2).

Figure 3:
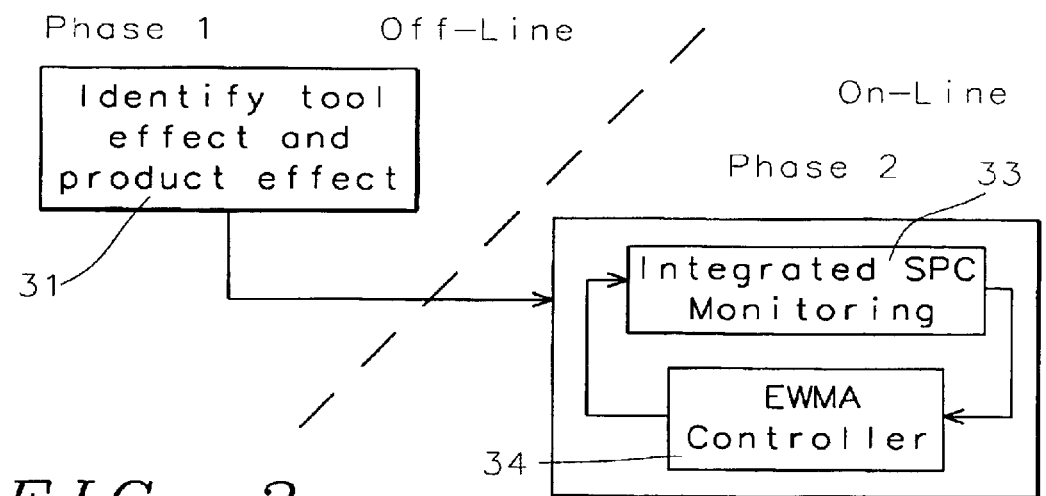
FIG. 3 is a diagram of the two phases of the MRBR control process of the present invention.

The MRBR control scheme of the present invention consists of two phases, as illustrated in FIG. 3. The first phase uses information from past data to estimate P(i) and T(j) for i=1, . . . , m and j=1, . . . , n (31). This phase takes place off-line. The second phase takes place on-line and uses this prediction model to implement a hierarchical feedback control scheme. Phase II includes adjusting the recipe by an Exponential Weighted Moving Average (EWMA) controller 34 and detecting the changes on tool effect and product effect using integrated statistical process control 33.

Figure 4:
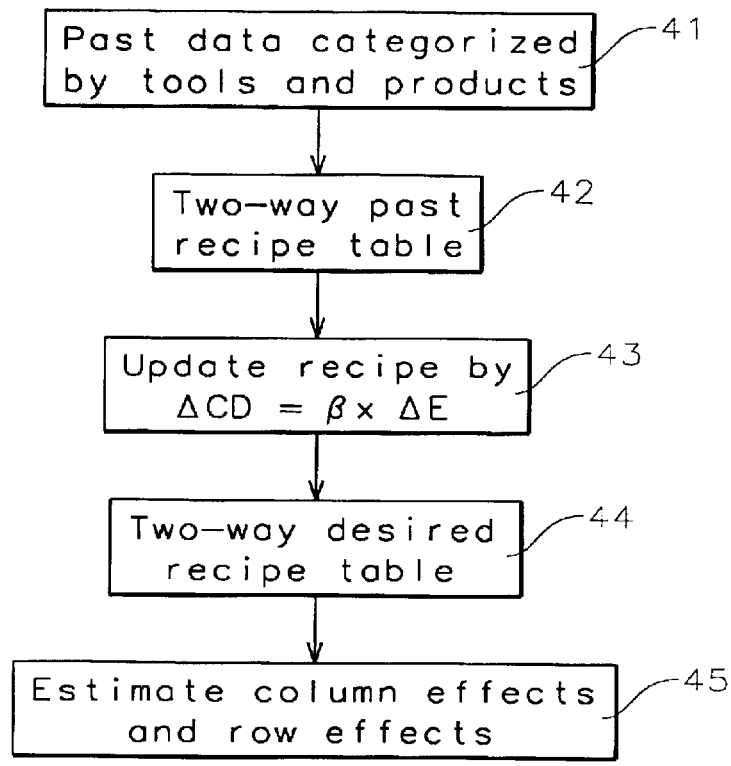
FIG. 4 is a flow chart showing Phase I of the present invention.

FIG. 4 illustrates a flow chart of Phase I. The goal of Phase I is to reduce the number of parameters and provide initial estimates from past data. For m products and n tools, the number of parameters is reduced from m×n to m+n. The product effect for each product P(i) and the tool effect for each tool T(j) are to be estimated. This is step 41 in FIG. 4. In step 42, the past-recipe table is to be generated. Equation (2) above can be approximately expressed as the following linear model:

$$\log E(i,j)=\log P(i)+\log T(j)+\epsilon(i,j) \qquad (3)$$

where ϵ(i,j) is the energy setting for product i in tool j.

Figure 5:
FIG. 5 is a sample recipe table used in the process of the present invention.

In step 44, the past recipe table is to be updated by applying equation (2) for the known cells (step 43). In practice, some of the E(i,j) terms are not available. FIG. 5 illustrates this situation. For example, the hatched cell (1,2) denotes that the product 1 has been run on tool 2 and the information of E(1,2) is available. The empty cell (1,1) denotes that the product 1 has not been run on tool 2 recently. Thus E(1,1) is not available from the databank.

For this kind of missing data, an expectation maximization (EM) algorithm can be used to estimate the exposure doses for all empty cells. For example, let P(i) and T(j) denote the estimates of P(i) and T(j) for all i=1, . . . , m and j=1, . . . , n, respectively. The two-way analysis of variance (ANOVA) method is used to estimate these effects. Column means and row means are calculated using the following equations:

$$E(.,J)[k] = \sum_{I=1}^{N} E(I,J)[k], J=1,2,\ldots,M \qquad (4)$$

$$E(I,.)[k] = \sum_{I=1}^{N} E(I,J)[k], I=1,2,\ldots,M \qquad (5)$$

where k is the iteration number and M is the stop condition. Next, the recipes for the missing cells are calculated as follows:

$$E(I,J)[k+1]=M\times(N\times E(.,J)[k]-E(I,J)[k])+N\times(M\times E(I,.)[k]-E(I,J)[k])-(N\times M\times E(.,.)-E(I,J)[k])/((N-1)(M-1)) \qquad (6)$$

The stop condition is estimated by the following:

$$M=\Sigma(E(I,J)[k+1]-E(I,J)[k])^2 \qquad (7)$$

The error term can be estimated by $$C(i,j)=E(i,j)-P(i)\times T(j) \qquad (8)$$

for all i=1, . . . , m and j=1, . . . , n.

Figure 6:
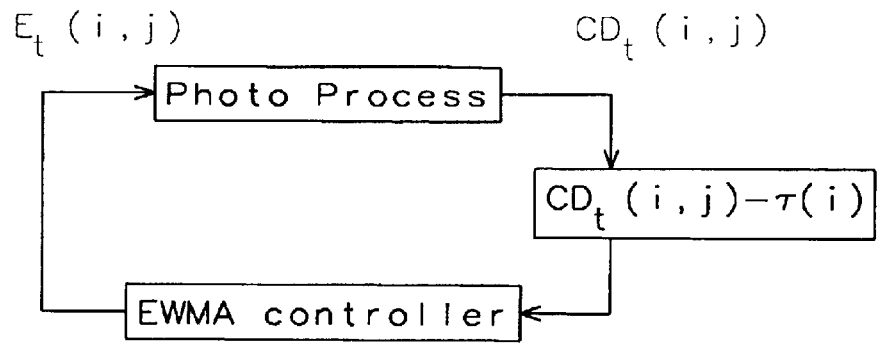
FIG. 6 is a flow chart of Phase II, Level 1 of the process of the present invention.

Phase II of the MRBR control process has two levels. Level 1, illustrated in FIG. 6, involves updating the exposure dose. Let τ(i) denote the target of the i-th product and β(i) denote the slope of equation (1). Assume that $C_{t-1}(i,j)$ denotes the estimate of the error term of equation (2) at the beginning of the t-th run; that is, the exposure dose setting is given by:

$$E_{t-1}(i,j)=P(i)\times T(j)+C_{t-1}(i,j) \qquad (9)$$

Assume that $CD_t(i,j)$ denotes the critical dimension at the end of the t-th run. For the (t−1)-th run, $C_t(i,j)$ is updated by the following EWMA controller, as shown in FIG. 2:

$$C_t(i,j)=C_{t-1}(i,j)+w(i,j)\times\beta(i)(CD_t(i,j)-\tau(i)) \qquad (10)$$

where w(i,j) is the discount factor of the EWMA controller and the new exposure dose setting is obtained by:

$$E_t(i,j)=P(i)\times T(j)+C_t(i,j) \qquad (11)$$

Note that $C_0(i,j)$ is given by Phase I.

Figure 7:
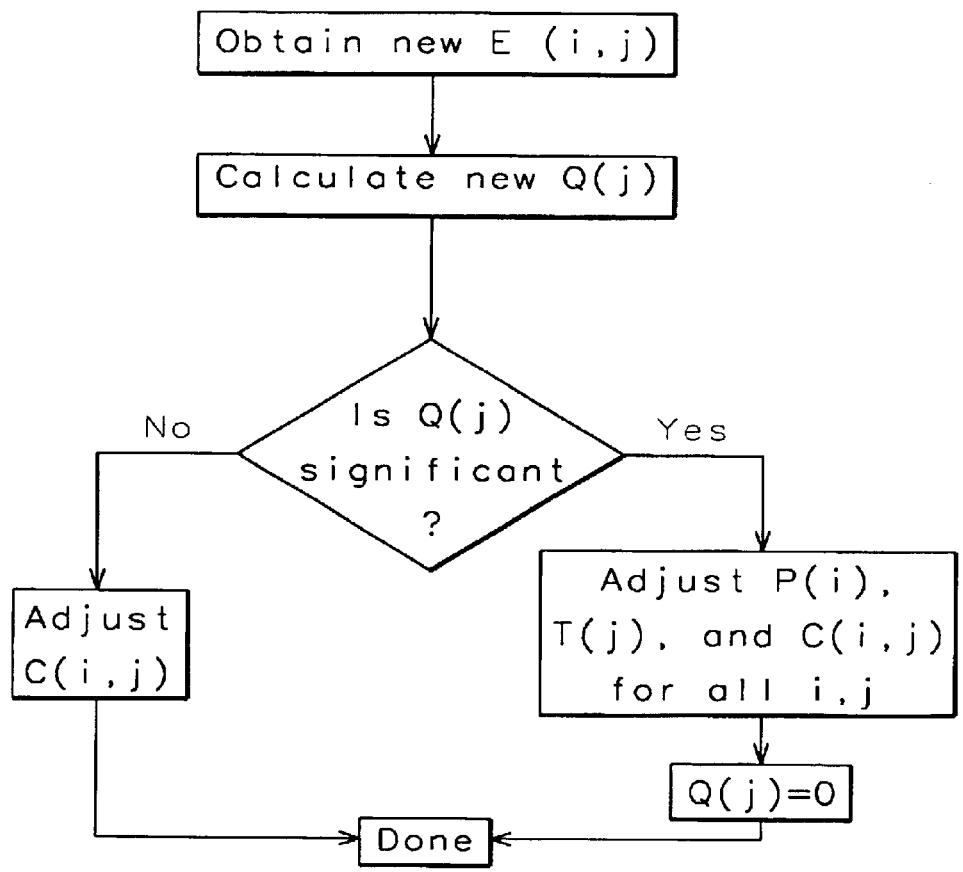
FIG. 7 is a flow chart of Phase II, Level 2 of the process of the present invention.

Level 2, detecting aging of a tool, is illustrated in FIG. 7. In practice, there are two major situations that will cause changes in exposure dose: 1) tool (machine) aging and 2) incoming variation shift of product. If the j-th tool is aging, then the effect of T(j) is getting larger and larger. According to equation (2), we will find that the exposure dose setting is gradually increasing for most products. To overcome this difficulty, we use the following approach. Let Q(j) be the indicator of the aging of the j-th tool, It is adjusted run by run for the same tool. For instance, the current product i is the product by tool j at the t-th run. After it is done, the new exposure dose setting $E_t(i,j)$ is obtained by equation (11) of level 1, then $$Q_{new}(j)=Q_{old}(j)+\log(E_t(i,j)/E_{t-1}(i,j)) \qquad (12)$$

regardless of what product is being run now. As shown in FIG. 7, if the absolute value of Q(j) is not significantly large, then it is necessary to adjust the estimate $C_t(i,j)$ of the error term in Phase II which is obtained by the Level 1 algorithm. Otherwise, there is an alarm signaling the tool aging when the absolute value of Q(j) is significantly large. We update the estimate T(j) of the j-th tool and the product effects P(i) and the error terms C(i,j) are simultaneously revised for all i,j.

Figure 8A:
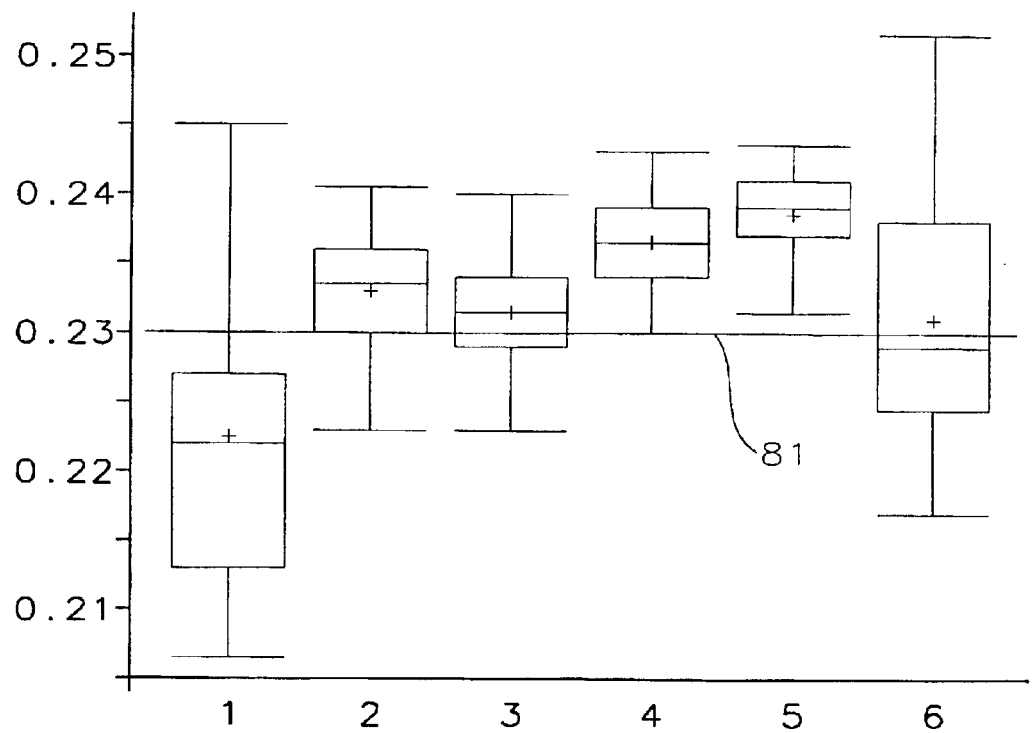
FIG. 8A is a box plot of the critical dimension of various tools of the prior art.
Figure 8B:
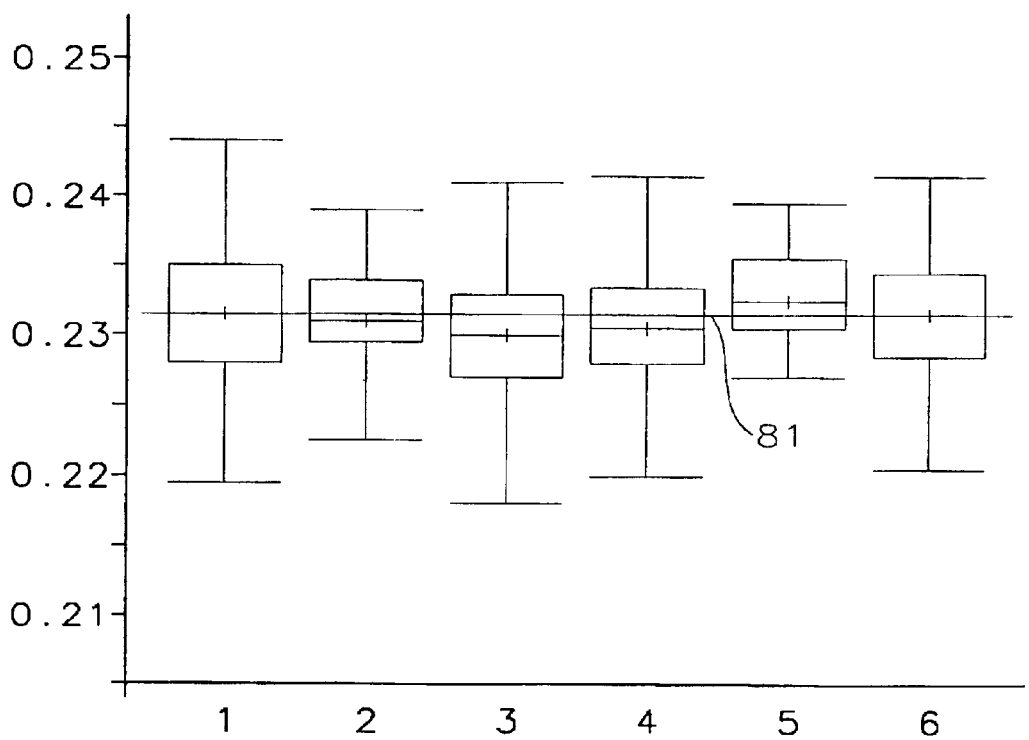
FIG. 8B is a box plot of the critical dimension of various tools under implementation of the present invention.

The MRBR process of the present invention has been implemented. FIG. 8A shows a box plot of CD from multiple tools without implementation of the MRBR control process of the invention. FIG. 8B shows a box plot of CD from multiple tools with implementation of the MRBR control process of the present invention. It can be seen that the within-tool variation can be reduced significantly by the process of the invention. In addition, with the process of the invention, the output CD is closer to the process target, line 81. More specifically, the process capability index is increased by 30% and the rework rate is reduced by 48%. Moreover, the operating workload is reduced by approximately 75% and the error rate caused by manual fine-tuning can be eliminated. In addition, due to the fact that photolithography is a key step in integrated circuit processes, the final product yield can be improved significantly and wafer output increased by 0.43%.

The multiple run by run process control system of the present invention reduces the process parameters from m×n to m+n. An adequate recipe is provided for the initial run. The exposure dose, or other recipe, is adjusted for each product by tools run to run using a varied weighted EWMA controller, even if the product was not run recently, and integrating information about tool aging.

While the invention has been particularly shown and described with reference to the preferred embodiments thereof, it will be understood by those skilled in the art that various changes in form and details may be made without departing from the spirit and scope of the invention.

What is claimed is:

1. A method of process control comprising:

providing a plurality of tools and a plurality of products to be run on said tools;

identifying tool effects on a parameter for each tool and product effects on parameter for each product;

calculating a desired recipe for each product on each tool based on said tool effects and said product effects;

thereafter running said plurality of products on said plurality of tools;

updating said desired recipe after each run of each tool; and calculating tool aging after each run of each said tool based on said desired recipe used wherein said product effects are denoted by P(i) for i=1, ..., m and wherein said tool effects are denoted by T(j) for j=1, ..., n and wherein said desired recipe for each recipe(i,j) is calculated by using the following equation 1:

$$recipe(i,j)=P(i)\times T(j)+C(i,j)$$

wherein C(i,j) is an error term.

2. The method according to claim 1 wherein said product effects and said tool effects are estimated based on past data.

3. The method according to claim 1 wherein each said recipe(i,j) is calculated for known combinations of tools and products.

4. The method according to claim 1 wherein for unknown combinations of tools and products, each said recipe(i,j) is estimated using an expectation maximization algorithm.

5. The method according to claim 4 wherein column means and row means are used to estimate unknown P(i) and T(j).

6. The method according to claim 1 wherein after each run of each tool, said error term is updated based on an exponential weighted moving average controller and wherein a new said desired recipe is calculated using said updated error term in said equation 1.

7. The method according to claim 1 wherein said measure of tool aging is given by Q(j) and wherein said step of calculating tool aging uses the following equation 2:

$$Q_{new}(j)=Q_{old}(j)+\log((recipe_t(i,j)/recipe_{t-1}(i,j))$$

wherein t denotes the current time and t−1 denotes a previous time interval.

8. The method according to claim 7 further comprising comparing the absolute value of Q(j) to a standard wherein if said absolute value of Q(j) is significant, then P(i), T(j), and C(i,j) terms of said equation 1 are adjusted for all i,j and Q(j) is set to zero and wherein if said absolute value of Q(j) is insignificant, thin C(i,j) is adjusted.

9. A method of process control of a photolithography process comprising:

providing a plurality of photolithography tools and a plurality of products to be run on said photolithography tools;

identifying tool effects on critical dimension for each photolithography tool and product effects on critical dimension for each product;

calculating a desired exposure dose for each product on each said photolithography tool based on said tool effects and said product effects;

thereafter running said plurality of products on said plurality of photolithography tools;

updating said desired recipe after each run of each said photolithography tool; and calculating tool decay after each run of each said photolithography tool based on said exposure dose used wherein said product effects are denoted by P(i) for i=1, ..., m and wherein said tool effects are denoted by T(j) for j=1, ..., n and wherein said desired recipe for each recipe(i,j) is calculated by using the following equation 1:

$$recipe(i,j)=P(i)\times T(j)+C(i,j)$$

wherein C(i,j) is an error term.

10. The method according to claim 9 wherein said product effects and said tool effects are estimated based on past data.

11. The method according to claim 9 wherein each said recipe(i,j) is calculated for known combinations of tools and products.

12. The method according to claim 9 wherein for unknown combinations of tools and products, each said recipe(i,j) is estimated using an expectation maximization algorithm.

13. The method according to claim 12 wherein column means and row means are used to estimate unknown P(i) and T(j).

14. The method according to claim 9 wherein after each run of each photolithography tool, said error term is updated based on an exponential weighted moving average controller and wherein a new said desired recipe is calculated using said updated error term in said equation 1.

15. The method according to claim 9 wherein said measure of tool aging is given by Q(j) and wherein said step of calculating tool aging uses the following equation 2:

$$Q_{new}(j)=Q_{old}(j)+\log((recipe_t(i,j)/recipe_{t-1}(i,j))$$

wherein t denotes the current time and t−1 denotes a previous time interval.

16. The method according to claim 15 further comprising comparing the absolute value of Q(j) to a standard wherein if said absolute value of Q(j) is significant, then P(i), T(j), and C(i,j) terms of said equation 1 are adjusted for all i,j and Q(j) is set to zero and wherein if said absolute value of Q(j) is insignificant, then C(i,j) is adjusted.

17. A method of process control comprising:

in a first phase performed off-line:

providing a plurality of tools and a plurality of products to be run on said tools;

identifying tool effects on a parameter for each tool and product effects on said parameter for each product; and calculating a desired recipe for each product on each tool based on said tool effects and said product effects; and in a second phase performed in real-time:
thereafter running said plurality of products on said plurality of tools;
updating said desired recipe after each run of each tool; and
calculating tool aging after each run of each tool based on said desired recipe used wherein said product effects are denoted by P(i) for i=1, ..., m and wherein said tool effects are denoted by T(j) for j=1, ..., n and wherein said desired recipe for each recipe(i,j) is calculated by using the following equation 1:

$$recipe(i,j) = P(i) \times T(j) + C(i,j)$$

wherein C(i,j) is an error term.

18. The method according to claim 17 wherein each said recipe(i,j) is calculated for known combinations of tools and products and wherein for unknown combinations of tools and products, each said recipe(i,j) is estimated using an expectation maximization algorithm.

19. The method according to claim 17 wherein after each run of each photolithography tool, said error term is updated based on an exponential weighted moving average controller and wherein a new said desired recipe is calculated using said updated error term in said equation 1.

20. The method according to claim 17 wherein said measure of tool aging is given by Q(j) and wherein said step of calculating tool aging uses the following equation 2:

$$Q_{new}(j) = Q_{old}(j) + \log((recipe_t(i,j)/recipe_{t-1}(i,j)))$$

wherein t denotes the current time and t−1 denotes a previous time interval and further comprising:
comparing the absolute value of Q(j) to a standard wherein if said absolute value of Q(j) is significant, then P(i), T(j), and C(i,j) terms of said equation 1 are adjusted for all i,j and Q(j) is set to zero and wherein if said absolute value of Q(j) is insignificant, then C(i,j) is adjusted.

* * * * *